United States Patent
Cameron et al.

(10) Patent No.: US 6,811,961 B2
(45) Date of Patent: Nov. 2, 2004

(54) PHOTOACID GENERATOR SYSTEMS FOR SHORT WAVELENGTH IMAGING

(75) Inventors: James F. Cameron, Cambridge, MA (US); Gerhard Pohlers, Newton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 266 days.

(21) Appl. No.: 10/082,767

(22) Filed: Feb. 25, 2002

(65) Prior Publication Data

US 2003/0013049 A1 Jan. 16, 2003

Related U.S. Application Data

(60) Provisional application No. 60/271,403, filed on Feb. 25, 2001.

(51) Int. Cl.$^7$ .................................................. G03C 5/00
(52) U.S. Cl. ....................... 430/325; 430/326; 430/905; 430/914; 430/919
(58) Field of Search ................................ 430/325, 326, 430/905, 914, 919, 270.1, 921, 922, 926; 522/31

(56) References Cited

U.S. PATENT DOCUMENTS 5,077,174 A * 12/1991 Bauer et al. ............. 430/270.1
5,939,242 A * 8/1999 Tang et al. ................. 430/329
6,235,358 B1 * 5/2001 Goto et al. ................. 428/35.7
6,399,273 B1 * 6/2002 Yamada et al. .......... 430/270.1

FOREIGN PATENT DOCUMENTS

| DE | 195 25 221 A | 1/1996 |
|----|---|---|
| EP | 0 727 713 | 8/1996 |
| EP | 0 930 542 | 7/1999 |

OTHER PUBLICATIONS

International Search Report of corresponding PCT Application; International Searching Authority/European Patent Office; Date of Mailing Sep. 3, 2002.

* cited by examiner

*Primary Examiner*—Rosemary Ashton
(74) *Attorney, Agent, or Firm*—Peter F. Corless; Darryl P. Frickey; Edwards & Angell, LLP

(57) ABSTRACT

New photoacid generator systems that comprise a sensitizer compound and one or more photoacid generator compounds are provided and photoresist compositions that comprise such systems. Photoacid generator systems of the invention are particularly useful as photoactive components of photoresists imaged at short wavelengths such as 248 nm, 193 nm and 157 nm.

15 Claims, No Drawings

PHOTOACID GENERATOR SYSTEMS FOR SHORT WAVELENGTH IMAGING

The present application claims the benefit of U.S. provisional application No. 60/271,403, filed Feb. 25, 2001, which is incorporated herein by reference in its entirety.

BACKGROUND OF THE INVENTION

1. Field of the Invention

This invention relates to new photoacid generator ("PAG") systems and photoresist compositions that comprise such systems. PAG systems of the invention in, general comprise one or more photoacid generator compounds and one or more sensitizer compounds. PAGs of the invention are preferably employed in resists imaged at short wavelengths, such as sub-200 nm, e.g. 193 nm and 157 nm.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See, e.g., U.S. Pat. No. 4,450,360 and European Application 615163.

More recently, certain "chemically amplified" photoresist compositions have been reported. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

SUMMARY OF THE INVENTION

We have now discovered novel photoacid generator systems for use in either positive-acting or negative-acting photoresist compositions.

We have found that excessive absorbance can remain an issue for resists imaged at short wavelengths such as 193 nm, even where the resist resin is optimized for low absorbance such as by having little or no aromatic content. In particular, we have found that a targeted absorption "budget" for a short wavelength resist may be substantially consumed by the resin component alone.

Photoacid generator systems of the invention in general comprise one or more photoacid generator compounds and one or more sensitizer compounds. The sensitizer component can be integral (covalently linked) to another resist component, such as the resin or PAG, but more typically the sensitizer is a separate resist additive.

Preferred sensitizer compounds are aromatic systems, both heteroaromatic and carobcyclic aryl, including compounds that comprise separate and/or fused multi-ring aromatic systems. Preferred sensitizer compounds are electron rich and comprise one or more electron-donating substituents, such as e.g. optionally substituted alkyl preferably having 1 to about 20 carbon atoms, optionally substituted alkoxy preferably having 1 to about 20 carbon atoms, optionally substituted thioalkyl preferably having 1 to about 20 carbon atoms, optionally substituted thioalkoxy preferably having about 1 to 20 carbon atoms, hydroxy, optionally substituted thiohydroxyalkyl preferably having 1 to about 20 carbon atoms, and the like. Exemplary preferred sensitizer compounds are discussed below.

Sensitizer compound(s) can be employed in a resist in quite small amounts and thus can positively impact efficiency (i.e. photoacid generation) of the PAG component without unduly adding to the overall absorbance of the resist.

In fact, it has been found that addition of a sensitizer component can dramatically increase the sensitivity of a PAG component to short wavelength radiation, particularly sub-200 nm radiation such as 193 nm.

Preferred PAGs for use in the PAG systems of the invention can exhibit good transparency without significant loss of photoacidgeneration efficiency upon exposure to short wavelength radiation such as 193 nm.

Preferred PAGs for use in the PAG systems of the invention include sulfonium and iodonium compounds having a cation component that comprises one or more substituents of naphthyl, thienyl, or pentafluorophenyl, or a cation component that has a sulfur ring group such a thienyl, benzothiophenium, etc. Those substituents (chromophores) provide enhanced transparency of the PAG, while maintaining effective photoacid generation properties.

Additional preferred PAGs for use in the PAG systems of the invention include oxime sulfonate PAGs, preferably where the oxime carbon has one or two electron-withdrawing substituents. Also preferred are N-oxyimidosulfonate PAGs that preferably contain contain two or more N-oxyimidosulfoanate groups in a single PAG compound. Such compounds are capable of generating a molar excess of photogenerated acid per mole of the PAG compound.

Preferably, PAGs of the invention are used in positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon or a tertiary alicyclic carbon covalently linked to the carboxyl oxygen of the ester are generally preferred photoacid-labile groups of resins employed in photoresists of the invention.

As discussed above, preferred imaging wavelengths of photoresists of the invention include sub-200 nm wavelengths e.g. 193 nm and 157 nm.

Particularly preferred photoresists of the invention contain an imaging-effective amount of one or more PAGs (including PAGs of the below-discussed formulae) that is selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction; such polymers have been described in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups, such as polymers as described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624 and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, filed Aug. 28, 1998, all incorporated herein by reference; iii) and polymers that contain maleic anhydride.

Resists of the invention also may comprise a mixture of distinct PAGs, typically a mixture of 2 or 3 different PAGs, more typically a mixture that consists of a total of 2 distinct PAGs. Photoresists that contain such PAG mixtures can exhibit even further enhanced lithographic performance.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions.

The invention further provides articles of manufacture comprising substrates such as a microelectronic wafer or a flat panel display substrate having coated thereon the photoresists and relief images of the invention. Other aspects of the invention are disclosed infra.

DETAILED DESCRIPTION OF THE INVENTION

As discussed above, the invention provides photoacid generator systems for use in either positive-acting or negative-acting photoresist compositions. Photoacid generator systems of the invention in general comprise one or more photoacid generator compounds and one or more sensitizer compounds. The sensitizer component can be integral (covalently linked) to another resist component, such as the resin or PAG component, but more typically the sensitizer is a separate resist additive.

Sensitizers

Preferred sensitizer compounds are carbocyclic aryl or heteroaromatic materials that comprise 1, 2, 3 or 4 separate or fused aromatic rings. Heteroaromiatic compounds typically contain 1 to about 3 N, O or S ring members and from 6 to 18 or more total ring members. Carbocyclic aryl sensitizer compounds also typically contain from 6 to 18 carbon ring atoms. Preferably, a sensitizer compound will have one or more electron-donating ring substituents, typically 1, 2, 3, 4 or 5 electron-donating ring substituents, such as e.g. optionally substituted alkyl preferably having 1 to about 20 carbon atoms, optionally substituted alkoxy preferably having 1 to about 20 carbon atoms, optionally substituted thioalkyl preferably having 1 to about 20 carbon atoms, optionally substituted thioalkoxy preferably having about 1 to 20 carbon atoms, hydroxy, optionally substituted thiohydroxyalkyl preferably having 1 to about 20 carbon atoms, and the like.

Sensitizer compounds also may contain a linked separate or fused ring that is non-aromatic rings, such as a ring having from 3 to about 8 ring members, particularly cyclopentyl, cyclehexyl, thienyl and the like.

Some preferred sensitizer compounds for use in the PAG systems and resists of the invention include the following:

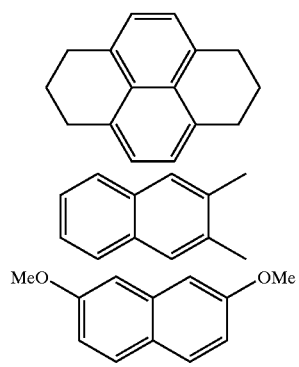

-continued

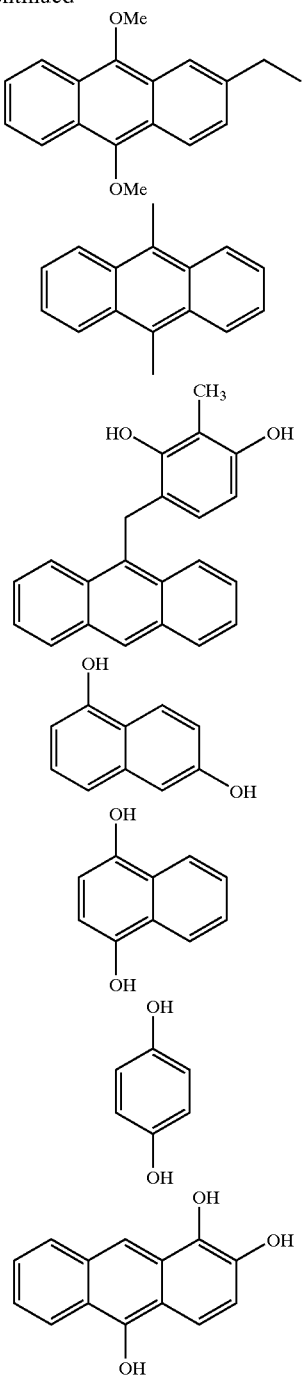

Photoacid Generator Compounds

A wide variety of photoacid generator compounds can be suitably employed in the PAG systems and resists of the invention. Such PAGS include onium compounds and non-aromatic PAGS such as imidosulfdonates and a variety of sulfone (including di-sulfone) PAG compounds.

As discussed above, particularly preferred PAGs for use in the PAG systems and resits of the invention include sulfonium and iodonium PAGs vided that contain at least one naphthyl substituent, preferably multiple naphthyl substituents. Preferred naphthyl-substituted PAGs of the invention include sulfonium and iodonium compounds of the following Formulae I and II:

wherein in Formulae I and II: each R is the same or different non-hydrogen substituent such as hydroxy, cyano, nitro, halogen, optionally substituted alkyl including cycloalkyl; optionally substituted alkenyl; optionally substituted alkynyl; optionally substituted alkoxy; optionally substituted alkylthio; optionally substituted alkylsulfinyl; optionally substituted alkylsulfonyl; optionally substituted alkanoyl; optionally substituted carbocyclic aryl; or optionally substituted heteroalicyclic or heteroaromatic suitably having 1–3 rings with 3–8 ring members per ring and 1–3 N, O or S atoms;

each n is an integer equal to 0 (where the naphthyl group has no non-hydrogen substituents) to 7, more typically 0, 1, 2, 3 or 4; and $R^1$ and $R^2$ are the same or different and each is suitably an aromatic or non-aromatic group such as e.g. optionally substituted alkyl including cycloalkyl; optionally substituted alkenyl; optionally substituted alkynyl; optionally substituted alkoxy; optionally substituted alkylthio; optionally substituted alkylsulfinyl; optionally substituted alkylsulfonyl; optionally substituted carbocyclic aryl; or optionally substituted heteroalicyclic or heteroaromatic suitably having 1–3 rings with 3–8 ring members per ring and 1–3 N, O or S atoms, with aromatic groups typically being preferred $R^1$ groups;

X is a counter anion, particularly an organic anion such as a sulfonate e.g. of the formula $R'SO_3$ where R' is suitably optionally substituted alkyl, particularly perfluoroalkyl typically having 1 to about 12 carbon atoms such as triflate and the like; carbocyclic aryl such as pentafluorophenylsulfonate; and the like; or X is suitably a carboxylate, e.g. groups of the formula R"COO— where R" is optionally substituted alkyl having 1 to about 18 carbons or optionally substituted aryl such as phenyl and the like. Preferred substituents of substituted carboxylate anions include halo, particularly fluoro.

Particularly preferred compounds of the above formulae are those that have multiple naphthyl groups, such as compounds of the following Formulae IA, IB, and IIA:

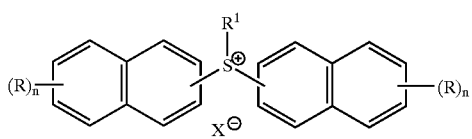

IB

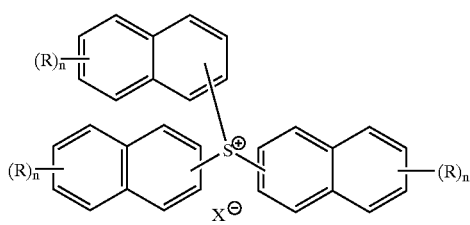

IIA

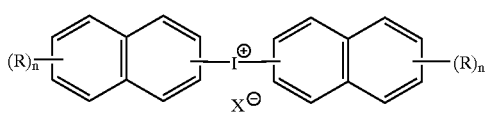

wherein in each of Formula IA, IB and IIA, R, n, R1 and X are the same as defined for Formulae I and II above.

In Formulae I and II, IA, IB and IIA, a naphthyl group may be linked to the iodonium or sulfonium cation at either the 1- or 2-naphthyl positions.

In a further aspect, sulfonium and iodonium PAGs are provided that contain at least one thienyl substituent. Preferred thienyl-substituted PAGs of the invention include sulfonium and iodonium compounds of the following Formulae III and IV:

III

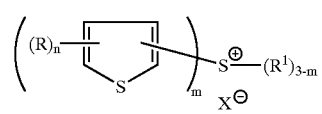

IV

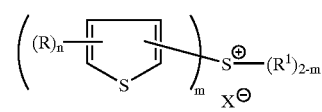

wherein in Formulae III and IV: R, $R^1$ and X are the same as defined in Formula I and II above;

in Formula III, m is 1, 2 or 3;

in Formula IV, m is 1 or 2 m is 1 or 2 and each n is an integer equal to 0 (where the thienyl group has no non-hydrogen substituents), 1, 2 or 3, preferably 0, 1 or 2.

Preferred PAGs of Formulae III and IV include compounds that have multiple thienyl substituents, such as compounds of the following Formulae IIIA, IIIB, and IVA:

IIIA

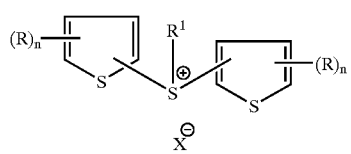

IIIB

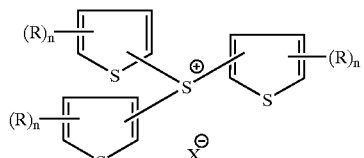

IVA

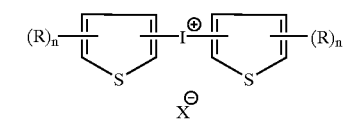

wherein in Formulae IIIA, IIIB and IVA: each R, $R^1$, n and X is the same as defined for Formulae III and IV above.

In Formulae III, IV, IIIA, IIIB and IVA a thienyl group may be linked to the iodonium atom or sulfonium atom at the 2- or 3-thienyl ring positions.

In a further aspect, sulfonium and iodonium PAGs are provided that contain at least one pentafluorophenyl substituent. Preferred pentafluorophenyl-substituted PAGs of the invention include sulfonium and iodonium compounds of the following Formulae V and VI:

V

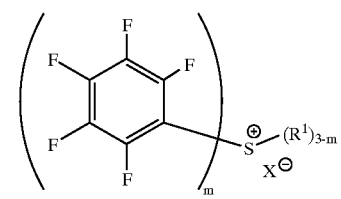

VI

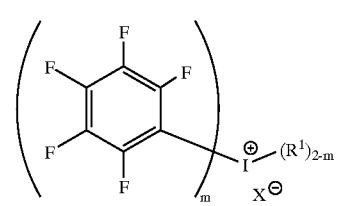

wherein in Formula V and VI: $R^1$ and X are the same as defined in Formulae I and II above;

in Formula V, m is 1, 2 or 3; and in Formula VI, m is 1 or 2.

Preferred PAGs of Formula V and VI include those that have multiple pentafluorophenyl groups, such as compounds of the following Formulae VA, VB and VIA:

VA

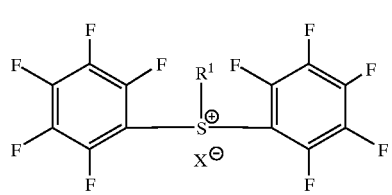

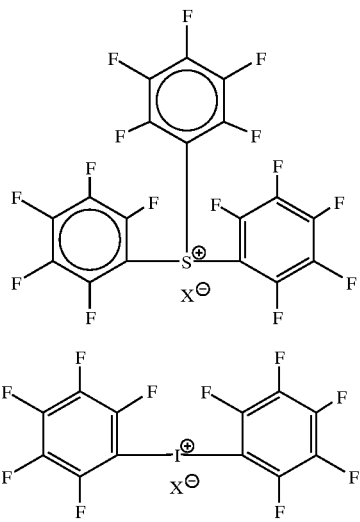

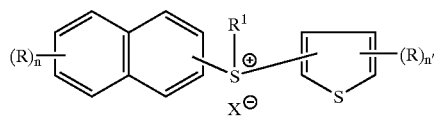

wherein in Formulae VA, VB and VIA: $R^1$ and X are the same as defined in Formulae I and II.

Preferred PAGs of the invention also include sulfonium and iodonium PAGs that contain at least two distinct substituents selected from the group consisting of naphthyl, thienyl and pentafluorophenyl, such as compounds of the following Formulae VII and VIII:

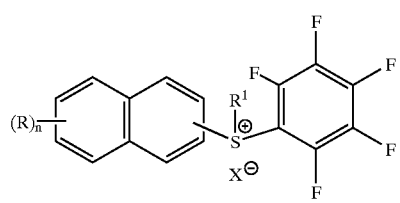

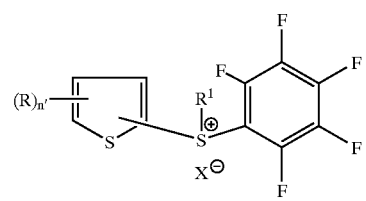

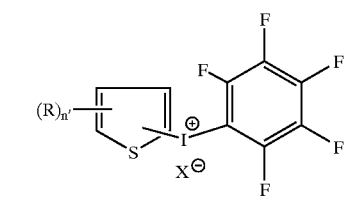

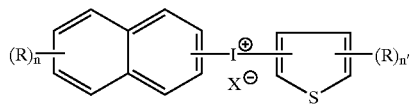

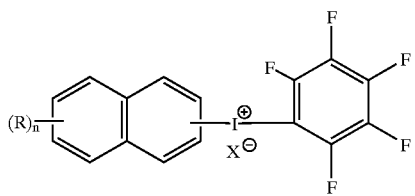

wherein in Formulae VII, VIII, IX, X, XI and XII: R, $R^1$, n and X are the same as defined in Formulae I and II above; and n' is an integer equal to 0 (where the thienyl group has no non-hydrogen substituents), 1, 2 or 3, preferably 0, 1 or 2.

Preferred $R^1$ groups of Formulae VII, VIII and IX include pentafluorophenyl, optionally substituted thienyl and optionally substituted naphthyl.

Preferred PAGs for use in the PAG systems and resists of the invention include sulfonium compounds where the sulfur cation is a ring member, e.g. a member of a ring having 3 to about 25 atoms (typically carbon) and 1 to 3 or 4 separate or fused rings. Thienyl rings are generally preferred, suitably optionally substituted, which substitutions can include one or more aromatic or alicyclic rings fused or otherwise linked to the thienyl ring.

Such preferred ring sulfonium cation PAGs include those of the following Formula XIII:

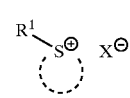

where $R^1$ and X are the same as defined in Formula I above; the dotted lines designate a ring structure that includes the depicted sulfur cation as a ring member, the ring suitably having 5 to about 8 ring members, and one, two or more endocyclic multiple bonds, and one or more optional substituents, including additional fused rings such as a phenyl or naphthyl that would linked by a single bond or fused to the sulfur cation-ring.

Generally preferred are compounds where the sulfur cation is a member of a thienyl-based ring system, such as PAGs of the following Formula XIV:

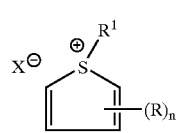

wherein R, R1, X and n are each the same as defined in Formula I above, and further where two R groups typically on adjacent ring atoms may together form a fused alicyclic or aromatic ring suitably having 5 to about 8 ring members such as optionally substituted phenyl (e.g. to provide a benzothiophenium group) or optionally substituted naphthyl fused to the thienyl group.

Another preferred group of sulfonium ring PAGs for use in the PAG sensitizer systems and resists of the invention include those of the following Formula XIVA:

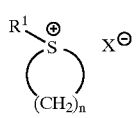

wherein in Formula XIVA, $R^1$ and X are each suitably the same as defined in Formula I above; and n is suitably 2 to about 10, more typically 2 to about 7, and preferably n is 2, 3, 4, or 5; and the ring may be optionally substituted;

and the sulfonium ring may be suitably substituted in 1 or more positions, typically 1, 2 or 3 ring substitutent, by groups as defined for $R^1$.

Preferred compounds of Formula XIVA include those where:

i) n is 4 and R is optionally substituted naphthyl, pentafluorophenyl, optionally substituted thienyl including optionally substituted 2-thienyl and 3-thienyl, and optionally substituted phenyl; and ii) n is 5–10 and R is optionally substituted naphthyl, pentafluorophenyl, optionally substituted thienyl including optionally substituted 2-thienyl and 3-thienyl, and optionally substituted phenyl.

However, less preferred compounds of Formula XIVA, and excluded from preferred embodiments of the invention, are compounds where n is 4, and R is naphthyl substituted by —O—$R_2$, particularly 4—O—$R_2$, where $R_2$ is H, $CH_3$, or methylphenol, methoxyphenol, or butylphenol; where n is 5–10.

Preferred counter anions (group X) of compounds of Formula XIV include $R_1SO_3^-$ where $R_1$ is haloalkyl such as halo$C_{1-12}$alkyl particularly perhaloalkyl such as perfluoro$C_{1-12}$alkyl, 2,2,2-trifluorethyl, camphoryl including 10-camphoryl, optionally substituted carbocyclic aryl, cyclo($C_{3-18}$)alkyl, α,α-difluorocyclo($C_{3-18}$)alkyl and the like.

In each of the above formulae, preferably two hetero atoms (N, O or S) are not adjacent to each other. Thus for example, in Formulae I and II, if an R1 substituent is alkoxy, preferably the oxygen of the alkoxy is not directly linked to the $S^+$ (Formula I) or $I^+$ (Formula II) atoms; rather, at least a single carbon spacer (e.g. —$CH_2$—) will be interposed between the $S^+$ or $I^+$ atoms and the oxygen of the alkoxy linkage.

Preferred R groups of compounds of Formulae I, II, IA, IB, IIA, III, IV, IIA, IIIB, IVA, VII, VIII, IX, X, XI, XII, XIII, XIV and XIVA include hydroxy; halogen, particularly F, Cl or Br; optionally substituted $C_{1-16}$alkoxy such as methoxy and ethoxy, $C_{1-16}$alkyl such as methyl, ethyl and perfluoroalkyl such as trifluoromethyl, pentafluoroethyl, etc.

Preferred $R^1$ and $R^2$ groups of compounds of Formulae I, II, IA, III, IV, IIIA, V, VI, VII, VIII, IX, XIII, XIV, XIV and XIVA include cyclic groups, particularly aromatic groups such as optionally substituted carbocyclic aryl such as phenyl, and substituted phenyl such as halo-phenyl preferably pentafluorophenyl, naphthyl and the like; and heteroaromatic groups such as thienyl and the like. Carbon alicyclic and heteroalicyclic groups also will be suitable $R^1$ and $R^2$ groups such as adamantyl, fenchyl and the like.

Generally preferred X anion groups of compounds of the above formulae are organic anions, including sulfonate and carboxylate anions. Preferred sulfonate X anion groups include those of the formula R'$SO_3$ where R' is suitably optionally substituted alkyl, particularly perfluoroalkyl typically having 1 to about 12 carbon atoms such as triflate and the like; carbocyclic aryl such as pentafluorophenyl sulfonate; and the like. Preferred carboxylate X groups include those of the formula R"COO— where R" is optionally substituted alkyl having 1 to about 18 carbons or optionally substituted aryl such as phenyl and the like. Preferred substituents of substituted carboxylate anions include halo, particularly fluoro.

Other suitable anion X groups include aresenic anions such as halogenated compounds e.g. $AsF_6^-$; phosphonium compounds such as halogenated P compounds, e.g. $PF_6^-$; and borates such as halo, alkyl and/or aryl substituted borate compounds, e.g. $B(C_6H_5)_4^-$ and $BF_4^-$.

Specifically preferred counter anions of PAG compounds of the invention (group X in above formulae) include:

2-acrylamido-2-methyl-1-propanesulfonate;
8-anilino-1-naphthylenesulfonate;
benzylsulfonate;
t-butanesulfonate;
4-t-butylbenzenesulfonate;
camphorsulfonate;
di-(2-ethylhexyl)succinatesulfonate;
2,6-difluorobenzoate;
3,4-dimethoxybenzenesulfonate;
5-dimethylamino-1-naphthalenesulfonate;
3-(4-dimethylamino-1-naphthylazo)-4-methoxybenzenesulfonate;
4-[(4-dimethylamino)phenylazo]benzenesulfonate;
2,4-dinitrobenzenesulfonate;
(2-/3-/4-)-dodecylbenzenesulfonate;
ethanesulfonate;
4-fluorobenzenesulfonate;
hexadecanesulfonate;
hexafluorophosphate;
methanesulfonate;
1-naphthalenesulfonate;
2-naphthalenesulfonate;
4-octylbenzenesulfonate;
pentafluorobenzenesulfonate;
pentamethylbenzenesulfonate;
4-pyridineethanesulfonate;
3-pyridinesulfonate;
thymol blue;
toluenesulfonate;
2,4,5-trichlorobenzenesulfonate;
2,2,2-trifluoroethanesulfonate;
trifluoromethanesulfonate (triflate);
trifluoroacetate;
2-trifluoromethylbenzenesulfonate;
3-trifluoromethylbenzenesulfonate;
4-trifluoromethylbenzenesulfonate;
3,5-bis(trifluoromethyl)benzeinesulfonate;
2,4,6-triisopropylbenzenesulfonate;
2,4,6-trimethylbenzenesulfonate;
perfluoroctanesulfonate;
perfluorohexanesulfonate;
perfluorobutanesulfonate; and
perfluoroethoxyethylsulfonate.

Of the above, the perfluoroalkyl and perfluoroalkoxy anions are often preferred such as triflate; perfluorocutanesulfonate; perfluorhexanesulfonate; and perfluoroethoxyethylsulfonate.

Additional preferred PAGs for use in PAG systems and resists of the invention include oxime sulfonate PAGs, preferably wherein the oxime carbon has one or two electron-withdrawing substituents. Preferred oxime sulfonate PAGs include those of the following Formula XV:

    XV wherein in Formula XV, at least one of R and R' is an electron-withdrawing moiety such as cyano, nitro, haloalkyl such as haloC$_{1-16}$alkyl, particularly fluoroalkyl e.g. perfluoro(C$_{1-16}$)alkyl such as —CF$_3$, —CF$_2$CF$_3$, and other perfluoralkyl; alkanoyl preferably having 1 to about 12 carbon atoms; alkylsulfinyl preferably having 1 to about 12 carbon atoms; alkylsulfonyl preferably having 1 to about 12 carbon atoms; and the like;

if only one of R and R' is an electron-withdrawing moiety, then one of R and R' is suitably optionally substituted carbocyclic aryl such as optionally substituted phenyl and optionally substituted naphthyl; optionally substituted alkyl preferably having 1 to about 20 carbon atoms; optionally substituted alkenyl preferably having 2 to about 20 carbon atoms; optionally substituted alkynyl preferably having 2 to about 20 carbon atoms; optionally substituted alkoxy preferably having 1 to about 20 carbon atoms; optionally substituted heteroalicyclic or heteroaromatic suitably having 1–3 rings with 3–8 ring members per ring and 1–3 N, O or S atoms such as thienyl;

Y is a non-hydrogen substituent such as optionally substituted carbocyclic aryl such as optionally substituted phenyl and optionally substituted naphthyl; optionally substituted alkyl preferably having 1 to about 20 carbon atoms; optionally substituted alkenyl preferably having 2 to about 20 carbon atoms; optionally substituted alkynyl preferably having 2 to about 20 carbon atoms; optionally substituted alkoxy preferably having 1 to about 20 carbon atoms; optionally substituted heteroalicyclic or heteroaromatic suitably having 1–3 rings with 3–8 ring members per ring and 1–3 N, O or S atoms such as thienyl.

In Formula XV, preferably R is an electron-withdrawing group and R' is an optionally substituted carbocyclic aryl or heteroalicyclic or heteromaromatic group. In Formula XV, particularly preferred R groups include cyano and haloalkyl such as C$_{1-16}$haloalkyl, particularly fluoroalkyl such as C$_{1-16}$perfluoroalkyl e.g. trifluoromethyl, pentafluorethyl, perfluorbutane and the like. In Formula XV, preferred R' groups incloude optionally substituted naphthyl, optionally substituted thienyl and optionally substituted pentafluorophenyl. In Formula XV, R and R' may be the same, or more typically R and R' are different. In Formula XV, preferred Y groups may be electron-withdrawing groups (to provide a stronger photoacid) such as haloalkyl, particularly perhalalkyl such as perfluoralkyl e.g. C$_{1-16}$perfluoroalkyl; carbocyclic aryl such as phenyl, naphthyl and the like, particularly substituted with one or more electron-withdrawing substituents such as nitro, cyano, halo (especially fluoro) with pentafluorophenyl being particularly preferred. Electron-donating groups also will be suitable Y groups such as optionally substituted alkyl e.g. C$_{1-12}$alkyl, although perhaps less preferred.

Additional preferred PAGs for use in PAG systems and resists of the invention include N-oxyimidosulfonate PAGs that preferably contain two or more N-oxyimidosulfonate groups are generally preferred. Bis-N-oxyimidosulfonate compounds are generally preferred, i.e. PAGs that contain two N-oxyimidosulfonate groups. Also preferred are N-oxyimidosulfonate compounds that do not contain an aromatic group. In particular, preferred are compounds of the following Formula XVIA:

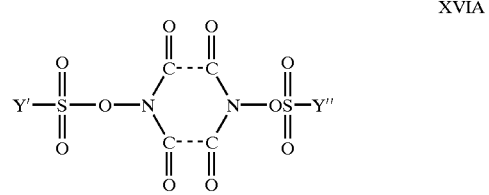    XVIA wherein Y' and Y" are the same or different non-hydrogen substituent such as the groups specified for Y in Formula XV above;

and the dotted lines indicate covalent linkage (to provide a single compound) between the two N-oxyimidosulfonate groups.

A variety of linkages between the N-oxyimidosulfnate groups. For example, the N-oxyimidosulfonate groups can each form 5, 6, 7, or 8-membered fused rings, such as PAGs of the following Formula VXIB:

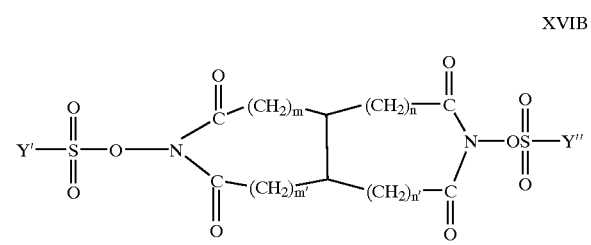    XVIB wherein Y' and Y" are the same or different non-hydrogen substituent such as the groups specified for Y in Formula XV above;

m, m', n, and n' are each independently 0, 1 or 2, and the sum of each of m and m' and of n and n' does not exceed 3.

Generally preferred PAGs of Formula XVIB include those where m, m', n and, n' are each zero, i.e. PAGs of the following Formula XVIB':

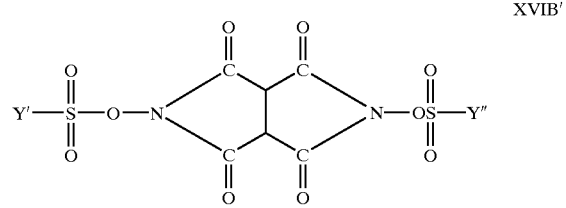    XVIB' wherein Y' and Y" are the same or different non-hydrogen substituent such as the groups specified for Y in Formula XV above;

Additional preferred PAGs of Formula XVIA include those where the two imidosulfonate groups each form a ring, and with a further ring interposed between the two imidosul fonate rings. For example, preferred PAGs include those of the following Formula XVIC:

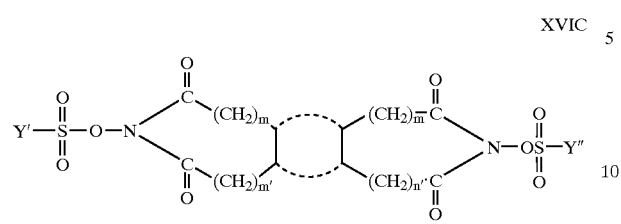

XVIC wherein Y' and Y" are the same or different non-hydrogen substituent such as the groups specified for Y in Formula XV above; m, m', n, and n' are the same as defined in Formula XVIB above; and the dotted lines designate an alicyclic, carbocyclic aryl, heteroalicyclic or heteroaromatic ring interposed between and fused to the two depicted imidosulfonate rings.

Preferred PAGs of Formuloa XVIC include those where m, m', n and n' are each zero, i.e. PAGs of the following Formula XVIC':

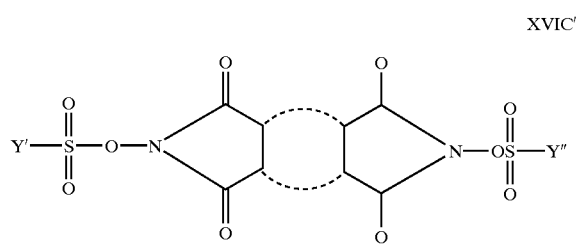

XVIC' wherein Y' and Y" are the same or different non-hydrogen substituent such as the groups specified for Y' and Y" in Formula XVIA above; and the dotted lines designate an alicyclic, carbocyclic aryl, heteroalicyclic or heteroaromatic ring interposed between and fused to the two depicted imidosulfonate rings.

Preferred interposed rings fused to imidosulfonate groups include cyclopentyl, cyclohexyl with an optional bridge group and naphthyl, such as compounds of the following Formula XVICa, XVICb and XVICc:

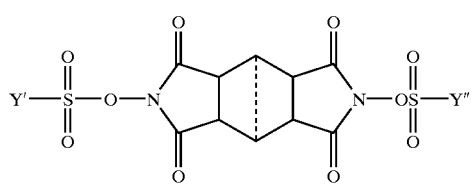

XVICa

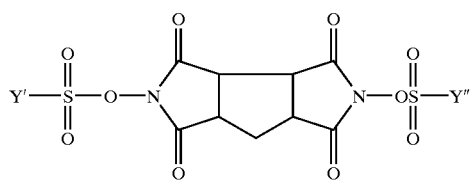

XVICb

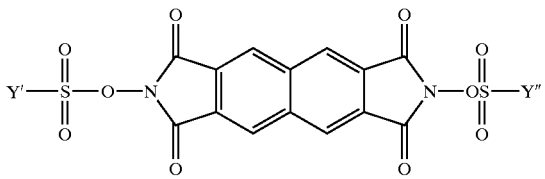

VICc wherein in each of Formulae XV, XVICa, XVICb, and XVICc, Y' and Y" are the same as defined in Formula XVIA; and the dotted line in Formula IICa designiates an optional bridge group such as alkylene or alkenylene groups such e.g. —CH$_2$—, —CH$_2$CH$_2$—, —CH$_2$CH$_2$CH$_2$—, —CH=CH—, —CH$_2$—CH=CH—, and the like.

In Formula XVIA, XVIB, XVIB', XVIC, XVIC', XVICa, XVICb, and XVICc, preferred Y, Y' and Y" groups including electron-withdrawing groups (to provide a stronger photoacid) such as haloalkyl, particularly perhalalkyl such as perfluoroalkyl e.g. C$_{1-16}$perfluoroalkyl such as trifluormethyl, pentafluoroethyl, perfluorobutylm perfluorobutane, and the like; carbocyclic aryl such as phenyl, naphthyl and the like, particularly substituted with one or more electron-withdrawing substituents such as nitro, cyano, halo (especially fluoro) with pentafluorophenyl being particularly preferred; heteroaromatic particularly optionally substituted thienyl; and alicyclic and heteroalicyclic groups. In Formula XVIA, XVIB,XVIB', XVIC, XVIC', XVICa, IICb, and IICc, electron-donating groups also will be suitable Y' and Y" groups such as optionally substituted alkyl e.g. C$_{1-12}$alkyl.

As stated above, various substituent groups of PAGs and sensitizers of PAG systems and resists of the invention may be optionally substituted. Substituted moieties (including substituted R, X, R$^1$, and R$^2$ groups of the above formulae) are suitably substituted at one or more available positions by, e.g., halogen such as F, Cl Br and/or I, nitro, cyano, sulfono, alkyl including C$_{1-16}$alkyl with C$_{1-8}$alkyl being preferred, haloalkyl such as fluoroalkyl (e.g. trifluoromethyl) and perhaloalkyl such as perfluoroC$_{1-4}$alkyl, alkoxy including C$_{1-16}$alkoxy having one or more oxygen linkages with C$_{1-8}$alkoxy being preferred, alkenyl including C$_{2-12}$alkenyl with C$_{2-8}$alkenyl being preferred, alkenyl including C$_{2-12}$alkenyl with C$_{2-8}$alkynyl being preferred, aryl such as phenyl or naphthyl and substituted aryl such as halo, alkoxy, alkenyl, alkynyl and/or alkyl substituted aryl, preferably having the number of carbon atoms mentioned above for corresponding groups. Preferred substituted aryl groups include substituted phenyl, anthracenyl and naphthyl.

As used herein, the term alkyl, alkenyl and alkynyl unless otherwise modified refers to both cyclic and noncyclic groups, although of course cyclic groups will comprise at least three carbon ring members. Alkenyl and alkynyl groups of compounds of the invention have one or more unsaturated linkages, typically 1 to about 3 or 4 unsaturated linkages. Also, the terms alkenyl and alkynyl as used herein refer to both cyclic and noncyclic groups, although straight or branched noncyclic groups are generally more preferred. Alkoxy groups of PAG compounds of the invention have one or more oxygen linkages, typically 1 to about 5 or 6 oxygen linkages. Alkylthio groups of PAGs of the invention have one or more thioether linkages, typically 1 to about 5 or 6 thioether linkages. Alkylsulfinyl groups of PAG compounds of the invention have one or more sulfinyl (SO) linkages, typically 1 to about 5 or 6 sulfinyl linkages.

Alkylsulfonyl groups of PAG compounds of the invention have one or more sulfonyl (SO$_2$) linkages, typically 1 to about 5 or 6 sulfonyl linkages. Preferred alkylamino groups of PAG compounds of the invention include those groups having one or more primary, secondary and/or tertiary amine groups, preferably 1 to about 3 or 4 amine groups. Suitable alkanoyl groups have one or more carbonyl groups, typically 1 to about 4 or 5 carbonyl groups. Alkoxy, alkylthio, alkylsulfinyl, alkylsulfonyl, alkanoyl and other groups may be suitably either linear or branched. Carbocyclic aryl as used herein refers to non-hetero aromatic groups that have 1 to 3 separate or fused rings and 6 to about 18 carbon ring members and may include e.g. phenyl, naphthyl, biphenyl, acenaphthyl, phenanthracyl, and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrazinyl, pyrimdinyl, furyl, pyrrolyl, thienyl, thiazolyl, oxazolyl, imidazolyl, indolyl, benzofuranyl, benzothiophene and benzothiazole.

PAGs of the invention can be readily prepared by known methods. More particularly, sulfonium PAGs of the invention can be prepared e.g. by Grignard reaction with a substituted sulfoxide compound. Thus, for instance, to prepare a tri-naphthyl sulfonium compound, of an optionally substituted naphthyl Grignard reagent, such as naphthyl magnesium chloride can be reacted with a di-naphthyl sulfoxide (where the naphthyl groups are the same or different). Iodonium compounds of the invention can be suitably prepared e.g. by methods disclosed in U.S. Pat. No. 5,879,856, Example 2 thereof. Thus, an iodonium PAG of the invention can be prepared by reaction of a mixture of an iodate such as potassium iodate, with a thienyl, naphthyl or pentafluorophenyl compound and acetic anhydride with sulfuric acid added suitably dropwise to the mixture, preferably at reduced temperatures such as provided by ice-bath cooling. Other compounds can be reacted to provide other substituents of the iodonium compound. The reaction mixture then can be suitably stirred at room temperature until substantial reaction completion to provide the desired cation. The mixture then can be cooled, e.g. to ca. 5–10° C., and then the anion component is added, e.g. a substituted sulfonic or carboxylic acid, followed by neutralization with suitable base such as ammonium hydroxide. To prepare iodonium PAG compounds having a thienyl substituent, synthetic methods can be employed as generally described in Beringer et al., *Journal of Organic Chemistry*, 35(16): 2095 (1970). To prepare iodonium PAG compounds having one or more naphthyl substituents, synthetic methods can be employed as generally described in Beringer et al., *Journal of Organic Chemistry*, 34(3):685 (1969). To prepare sulfonium PAGs of the invention where the sulfonium cation is a ring member (see Formulae XIII and XIV above), the sulfur ring compound such as thiophene or thianaphthene can be reacted with another addition group in the presence of copper benzoate. See generally Examples 1 through 5 which follow for preferred syntheses.

Oxime sulfonate PAGs can be prepared e.g. by reaction of an α-cyano compound of the formula NCCH$_2$—R wherein R is as defined in Formula XV above with amyl nitrate to provide the coreesponbding oxime of the formula NCC(=NOH)R. That oxime can be reacted with a substituted sulfonyl chloride (e.g. substituted with a group Y as defined in Formula XV above) to provide PAGs of Formula XV. N-oxyimidosulfonate PAGs can be suitably prepared e.g. by reaction of a corresponding anhydride such as bis-succnic anhydride with hydroxylamine to provide the corresponding N-hydroxy imide. That N-hydroxy imde then can be reacted with a substituted sulfonyl chloride (e.g. substituted with a group Y$^1$ as defined in Formula XVIA above).

Thus a PAG of the structure NC(1-naphthyl)C=NOS(O)$_2$C$_6$F$_5$ can be prepared by reaction of NCCH2-(1-naphthyl) with amyl nitrate to provide the oxime NCC(=NOH)(1-naphthyl). That oxime is reacted with pentafluorobenzene sulfonyl chloride to provide NC(1-naphthyl)C=NOS(O)$_2$C$_6$F$_5$.

As discussed above, PAGs of the invention are useful as the radiation sensitive component in photoresist compositions, including both positive-acting and negative-acting chemically amplified resist compositions.

The photoresists of the invention typically comprise a resin binder and a photoactive component of the invention as described above. Preferably the resin binder has functional groups that impart alkaline aqueous developability to the resist composition. For example, preferred are resin binders that comprise polar functional groups such as hydroxyl or carboxylate. Preferably the resin binder is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Additional suitable resins include those formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

Preferably, a photoacid generator compound of the invention is employed in a chemically amplified positive-acting resist. A number of such resist compositions have been described, e.g., in U.S. Pat. Nos. 4,968,581; 4,883,740; 4,810,613 and 4,491,628 and Canadian Patent Application 2,001,384, all of which are incorporated herein by reference for their teaching of making and using chemically amplified positive-acting resists. In accordance with the present invention, those prior resist compositions are modified by substitution of the photoactive component of the invention as the radiation sensitive component.

For imaging at wavelengths greater than 200 nm, such as 248 nm, a particularly preferred chemically amplified photoresist of the invention comprises in admixture a photoactive component of the invention and a resin binder that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

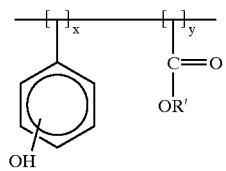

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$alkoxy, $C_{2-8}$alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Another preferred resin binder for a positive chemically amplified resist of the invention has phenolic and nonaromatic cyclic alcohol units, wherein at least of portion of the hydroxyl groups of the copolymer are bonded to acid labile groups. Preferred acid labile moieties are acetate groups including t-butyl acetate groups of the formula $(CH_3)_3COC(O)CH_2$—; oxycarbonyl groups such as t-butyl oxycarbonyl (t-Boc) groups of the formula $(CH_3)_3CC(O)O$—; and acetal and ketals. Chemically amplified positive-acting photoresists containing such a copolymer have been disclosed in U.S. Pat. No. 5,258,257 to Sinta et al.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

PAG systems of the invention also are preferably used with polymers that contain one or more photoacid-labile groups and that are substantially, essentially or completely free of phenyl or other aromatic groups. Such photoresist compositions are particularly useful for imaging with sub-200 nm radiation such as 193 nm radiation.

For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 of the Shipley Company.

Suitable polymers that are substantially or completely free of aromatic groups suitably contain acrylate units such as photoacid-labile acrylate units as may be provided by polymerization of methyladamantylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride; and the like.

Preferred negative-acting compositions of the invention comprise a mixture of materials that will cure, crosslink or harden upon exposure to acid, and a photoactive component of the invention.

Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, particularly tetrabutylammonium hydroxide (TBAH), which can enhance resolution of a developed resist relief image. The added base is suitably used in relatively small amounts, e.g. about 1 to 10 percent by weight relative to the PAG, more typically 1 to about 5 weight percent. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, tnphenylamine, aminophenol, 2-(4-aminophenyl)-2-(4-hydroxyphenyl)propane, etc.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures with the exception that a PAG system of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether and propylene glycol monomethyl ether acetate; lactates such as ethyl lactate or methyl lactate, with ethyl lactate being preferred; propionates, particularly methyl propionate, ethyl propionate and 3-ethyl ethoxypropionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Printed circuit board substrates such as copper clad laminates are also particularly preferred. The photoresists of the invention will be particularly useful for circuit board imaging, including through hole and other aperture plating. Typical printed circuit board substrates have one or more copper layers interleaved with resin layers, such as epoxy layers.

Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. As discussed above, preferred exposure wavelengths include sub-300 nm such as 248 nm, and sub-200 nm such as 193 nm and 157 nm. Suitable post-exposure bake temperatures are from about 50° C. or greater, more specifically from about 50 to 150° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting example is illustrative of the invention.

EXAMPLES 1–3

Sensitization Testing

Photoacid generator compound-sensitizer combinations were evaluated for radiation sensitivity. The following determinations were made:

1) the photospeed of the PAG/sensitizer combination is determined;

2) the photospeed of an identical sample without sensitizer is also determined. The comparison between these two photospeeds indicates whether there is any sensitization happening (sensitized sample has faster photospeed) or not (photospeed of sensitizer sample is slower than PAG-alone sample);

3) the photospeed of a sample containing no sensitizer where the PAG amount was adjusted so that its absorbance matches that of the sensitized sample is determined. If the photospeed of this adjusted PAG sample is still slower than that of the sensitized sample, sensitization is not only happening but actually more efficient than direct photolysis of the PAG.

The following table contains two examples of sensitizer PAG combinations where sensitization offers an advantage over direct excitation (examples 1 and 2). Results of a third system (example 3) are also shown.

| Photoacid generator | Sensitizer | E0 for sensitizer/ PAG combination | E0 for no sensitizer/ same PAG amount | E0 for adjusted PAG amount |
| --- | --- | --- | --- | --- |
| N-trifluoromethanesulfonyloxy-5-norbornene-2,3-dicarboximide (example 1) | hexahydro pyrene | 7.3 | 14.1 | 9.2 |
| dithienyliodonium perfluorobutanesulfonate (example 2) | hexahydro pyrene | 13.2 | 19.3 | 15.6 |
| S-(2,3,4-trimethoxyphenyl)-tetramethylenesulfonium triflate (example 3) | 1,6-dihydroxy naphthalene | 7.0 | 12.4 | — |

EXAMPLE 4

Resist Preparation and Lithographic Processing

A resist formulation comprising a copolymer of 2-methyl-2-adamantyl methacrylate and β-butyrolactone methacrylate (13.07 g of a 30 wt. % solution in 2-heptanone), N-trifluoromethanesulfonyloxy-5-norbornene-2,3-dicarboximide (0.146 g), hexahydropyrene (0.22 g), base additive (0.40 g of a 1 wt. % solution in 2-heptanone), a surfactant (0.40 g of a 1 wt. % solution in 2-heptanone) and 11.06 g 2-heptanone was prepared. The resulting solution was spin coated onto 820 Å thick AR19 (215° C./90 sec) coated silicon wafers (150 mm) on a Polaris system and baked (proximity) at 120° C. for 60 seconds to form a resist film having a thickness of 3900+/−25 Å. The resulting wafers were exposed on an ISI microstepper stepper under conventional illumination conditions. The wafers were post-exposure baked at 120° C. for 60 seconds then developed in LDD-26 using a 60 second single puddle process and the dose to clear determined.

Control samples without the sensitizer and a) the same PAG loading and b) with adjusted PAG loading were formulated and processed in the same way, except that no sensitizer was added and the PAG amount kept the same (a) or increased to 0.216 g (b).

EXAMPLES 5–9

Syntheses of Photoacid Generator Compounds

EXAMPLE 5

Preparation of di(1-naphthyl)phenylsulfonium triflate

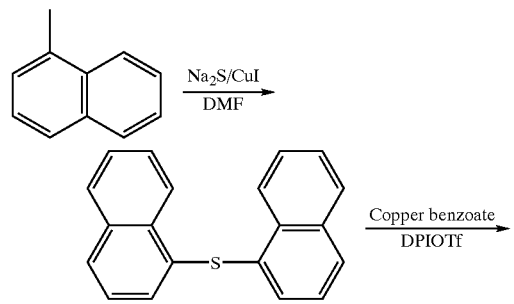

-continued

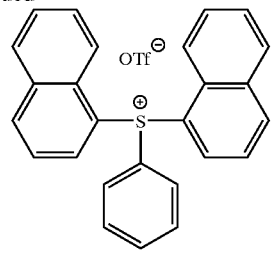

Under a nitrogen atmosphere, anhydrous sodium sulfide (4.3 g, 0.055 mole) and CuI (1.9 g, 0.010 mole) is added to a solution of 1-iodonaphthalene (27.9 g, 0.110 mole) in 100 ml dry THF and the solution is refluxed for 24 h. After cooling, 500 ml water is added and the mixture extracted three times with dichloromethane (100 ml). The combined organic phases are washed with 2N NaOH (3×50 mL), dried and the solvent is removed. The brownish-yellow crude product is purified by column chromatography on silica gel (ethylacetate/cyclohexane 1:4), yielding 6 g (30%) of the sulfide as a white solid. The structure was confirmed by $^{1}H/^{13}C$ NMR spectroscopy.

Di(1-naphthyl)sulfide (3 g, 0.0104 mole), diphenyliodonium triflate (5.8 g, 0.0135 mole) and copperbenzoate (0.08 g, 0.003 mole) are heated without solvent for 3 hours at 120–145° C. under a nitrogen atmosphere. After cooling down, 75 ml ether was added and the mixture vigorously stirred overnight to achive solidification. Filtration and washing with ether yielded a brown solid, which was dissolved in hot water, the solution filtered and the water removed in vacuo. The resulting white solid was stirred in 50 ml ethyl ether for 24 hours, the mixture filtered and the residue washed with ethyl ether, yielding 4.8 g (90%) of the title compound, di-(1-naphtyl)phenylsulfonium triflate. The structure was confirmed by $^{1}H/^{13}C$ NMR spectroscopy.

EXAMPLE 6

Preparation of (2-thienyl)diphenylsulfonium triflate

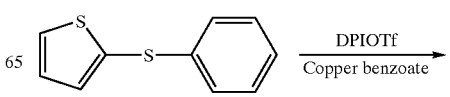

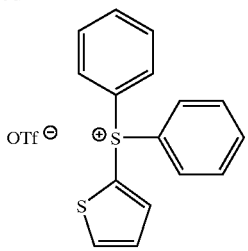

(2-thienyl)phenylsulfinde (2.0 g, 0.0104 mole), diphenyliodonium triflate (5.8 g, 0.0135 mole) and copper benzoate (0.08 g, 0.003 mole) are heated without solvent for 3 hours at 120–145° C. under nitrogen atmosphere. After cooling dow 75 ml ethyl ether was added and the mixture vigorously stirred overnight to achieve solidification. Filtration and washing with ethyl ether yielded a brown solid, which was dissolved in hot water, the solution filtered and the water removed in vacuo. The resulting white solid was stirred in 50 ml ether for 24 hours, the mixture filtered and the residue washed with ethyl ether, yielding, 3.9 g (90%) of the title compound, (2-thienyl)diphenylsulfonium triflate. The structure was confirmed by $^1H/^{13}CMR$

EXAMPLE 7

Preparation of di-(2-thienyl)phenylsulfonium triflate

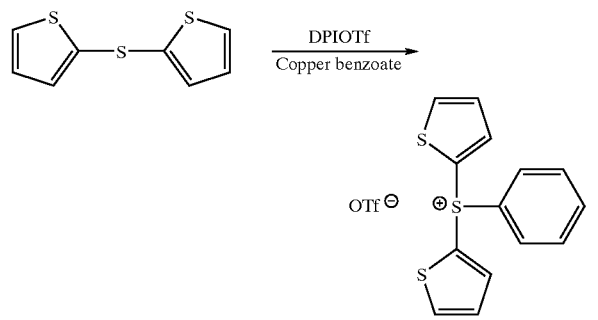

Di-(2-thienyl)sulfide (2.1 g, 0.0104 mole), diphenyliodonium triflate (5.8 g, 0.0135 mole) and copper benzoate (0.08 g, 0.003 mole) are heated without solvent for 3 hours at 120–145° C. under a nitrogen atmosphere. After cooling down, 75 ml ethyl ether was added and the mixture vigorously stirred overnight to achieve solidification. Filtration and washing with ethyl ether yielded a brown solid, which was dissolved in hot water, the solution filtered and the water removed in vacuo. The resulting white solid was stirred in 50 ml ethyl ether for 24 hours, the mixture filtered and the residue washed with ethyl ether, yielding 3.4 g (78%) of the title compound, di(2-thienyl)phenylsulfonium triflate. The structure was confirmed by $^1H/^{13}C$ NMR spectroscopy.

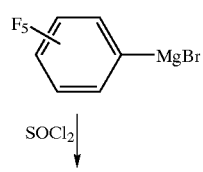

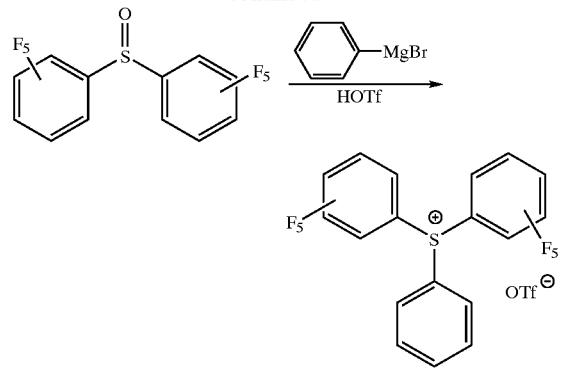

EXAMPLE 8

Preparation of di(pentafluorophenyl) phenylsulfonium triflate

To thionyl chloride (4 ml, 0.055 mole) in 12 ml ethyl ether is dropwise added a 0.5 M solution of pentafluorophenylmagnesium bromide in ethyl ether (100 g, 0.05 mole) at −25° C. with stirring. After the addition is complete, the mixture is allowed to warm to room temperature and the stirring is continued for 1 hour. The mixture is filtered, washed with water twice, dried over magnesium sulfate and the solvent removed in vacuo, yielding a brown solid. The residue from the filtration is dissolved in ethyl ether/water again, the phases are separated and the ethyl ether layer washed with water twice, dried over magnesium sulfate and the solvent removed in vacuo, yielding more crude product. The purification was done by sublimation and subsequent recrysallization from cyclohexane, yielding 6.9 g (72%) of the sulfoxide as a white solid.

A 3M solution of phenylmagnesium bromide in ether (17 ml, 0.05 mole) is heated slowly to 80° C. under vacuum to remove the ether. 8 ml benzene and 17 ml heptane were then added and subsequently pentafluorophenyl sulfoxide (3.8 g, 0.01 mole), dissolved in 15 ml benzene, was added dropwise at 80° C. over one hour. After stirring for three hours, the solution is allowed to cool to room temperature, followed by the addition of 33 ml of 25% triflic acid. The organic layer was seprated and extracted twice with 10 ml of 5% triflic acid. The aqueous layers were combined and extracted three times with 100 ml diclhoromethane and solvent removed after drying over magnesium sulfate, yielding 600 mg (10%) of di(pentafluorophenyl)phenyl sulfonium triflate. The structure was confirmed by $^1H/^{13}C$ NMR.

EXAMPLE 9

Preparation of 1-phenyl-2-methylbenzothiophenium triflate

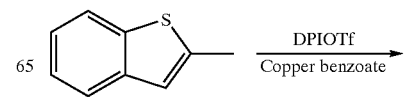

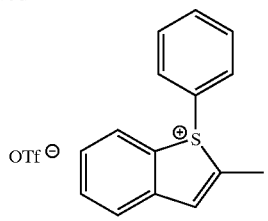

2-Methylthianaphthene (5 g 0.0327 mole), diphenyliodonium triflate (18.28 g, 0.0425 mole) and copper benzoate (0.1 g, 0.000327 mole) were heated without solvent for 0.5 hours at 140° C. under a nitrogen atmosphere. After cooling down, 150 ethyl ether was added to solidify the product. Filtration and washing with ethyl ether Yielded a brownish-grey solid, which was dissolved in 500 ml hot water, and the solution filtered and the water removed in vacuo. The resulting off-white solid was stirred in 50 ml ethyl ether for 1 hour, the mixture filtered and the residue washed with ethyl ether. The product was recrystallized from dichloromethane/t-butyl methyl ether to yield 8.97 g (76%) of 1-phenyl-2-methylbenzothiophenium triflate. The structure was confirmed by $^1$H/$^{13}$C NMR spectroscopy.

The foregoing description of the invention is merely illustrative thereof, and it is understood that variations and modifications can be effected without departing from the spirit or scope of the invention as set forth in the following claims.

What is claimed is:

1. A method for forming a photoresist relief image on a substrate comprising:
   (a) applying a coating layer of a photoresist composition on a substrate, the photoresist composition comprising a resin and a photoacid generator system, the system comprising a sensitizer compound and one or more photoacid generator compounds that is an iodonium or sulfonium photoacid generator compound which comprises one more cation substituents chosen from among optionally substituted naphthyl, optionally substituted thienyl and pentafluorophenyl;
   (b) exposing the photoresist coating layer to patterned activating radiation having a wavelength of less than about 200 nm and developing the exposed photoresist layer to provide a relief image.

2. The method of claim 1 wherein the photoresist coating layer is exposed to radiation having a wavelength of 193 nm.

3. The method of claim 1 wherein the sensitizer is a separate component of the photoresist composition.

4. The method of claim 1 wherein the sensitizer is an aromatic compound.

5. The method of claim 1 wherein the photoacid generator compound is an iodonium compound.

6. The method of claim 1 wherein the photoacid generator compound is a sulfonium compound.

7. The method of claim 1 wherein the photoacid generator compound comprises a sulfonium compound having a sulfur cation as a ring member.

8. The method of claim 1 wherein the photoresist composition is a chemically-amplified positive photoresist.

9. A method for forming a photoresist relief image on a substrate comprising:
   (a) applying a coating layer of a photoresist composition on a substrate, the photoresist composition comprising a resin and a photoacid generator system, the system comprising a sensitizer compound and one or more photoacid generator compounds that is a non-ionic oxime sulfonate compound or a non-ionic N-oxyimidosulfonate compound;
   (b) exposing the photoresist coating layer to patterned activating radiation having a wavelength of less than about 200 nm and developing the exposed photoresist layer to provide a relief image.

10. The method of claim 9 wherein the photoresist coating layer is exposed to radiation having a wavelength of 193 nm.

11. The method of claim 9 wherein the sensitizer is a separate component of the photoresist composition.

12. The method of claim 9 wherein the sensitizer is an aromatic compound.

13. The method of claim 9 wherein the photoacid generator compound is an oxime sulfonate compound.

14. The method of claim 9 wherein the photoacid generator compound is a N-oxyimidosulfonate compound.

15. The method of claim 9 wherein the photoresist composition is a chemically-amplified positive photoresist.

* * * * *